US 8,065,467 B2

(12) United States Patent
Micheloni et al.

(10) Patent No.: US 8,065,467 B2
(45) Date of Patent: Nov. 22, 2011

(54) NON-VOLATILE, ELECTRICALLY-PROGRAMMABLE MEMORY

(75) Inventors: Rino Micheloni, Turate (IT); Roberto Ravasio, Ponte San Pietro (IT)

(73) Assignee: Hynix Semiconductor Inc., Gyeonggi-do (KR)

( * ) Notice: Subject to any disclaimer, the term of this patent is extended or adjusted under 35 U.S.C. 154(b) by 671 days.

(21) Appl. No.: 11/844,465

(22) Filed: Aug. 24, 2007

(65) Prior Publication Data
US 2008/0052458 A1  Feb. 28, 2008

(30) Foreign Application Priority Data

Aug. 24, 2006  (EP) .................................... 06119479

(51) Int. Cl.
*G11C 11/56*    (2006.01)
*G11C 16/06*    (2006.01)
*G11C 16/22*    (2006.01)
*G06F 12/02*    (2006.01)
(52) U.S. Cl. ................ 711/103; 711/154; 711/E12.008; 365/185.03; 365/185.05; 365/195
(58) Field of Classification Search .................. None
See application file for complete search history.

(56) References Cited

U.S. PATENT DOCUMENTS

| | | | |
|---|---|---|---|
| 5,490,260 A * | 2/1996 | Miller et al. .................. 711/100 |
| 5,761,166 A * | 6/1998 | Sedlmayr et al. ............... 360/69 |
| 5,898,615 A * | 4/1999 | Chida ...................... 365/185.05 |
| 5,930,167 A | 7/1999 | Lee et al. |
| 5,933,365 A * | 8/1999 | Klersy et al. ................... 365/148 |
| 6,061,280 A * | 5/2000 | Aritome ........................ 365/195 |
| 6,145,069 A * | 11/2000 | Dye ............................. 711/170 |
| 6,418,052 B1 | 7/2002 | Shibata et al. |
| 6,456,528 B1 | 9/2002 | Chen |
| 6,657,891 B1 | 12/2003 | Shibata et al. |
| 2002/0196659 A1 * | 12/2002 | Hurst et al. .................... 365/175 |
| 2003/0053334 A1 * | 3/2003 | Chen ........................ 365/185.03 |
| 2005/0210184 A1 | 9/2005 | Chen et al. |
| 2006/0117268 A1 * | 6/2006 | Talley et al. ................... 715/769 |
| 2006/0294295 A1 * | 12/2006 | Fukuzo ......................... 711/105 |

FOREIGN PATENT DOCUMENTS

JP       2001/00637     1/2001
WO    WO 2005/096316 A1  10/2005

* cited by examiner

*Primary Examiner* — Reginald Bragdon
*Assistant Examiner* — Daniel Bernard
(74) *Attorney, Agent, or Firm* — William Park & Associates Ltd.

(57) ABSTRACT

A solid state mass storage device having a first storage area portion and a second storage area portion. The mass storage device including accessing means adapted to cause data to be stored in the first storage area portion in one of: only in memory cells belonging to columns of a first collection or only to columns of a second collection such that memory cells of the first storage area portion belonging to the first or second collection are left unprogrammed; or only in memory cells of even rows or only memory cells of odd row such that the memory cells of the first storage area belonging to the even or to the odd rows are left unprogrammed; or only in memory cells such that memory cells that are immediately adjacent to said memory cells in said row and column are left unprogrammed.

16 Claims, 7 Drawing Sheets

NON-VOLATILE, ELECTRICALLY-PROGRAMMABLE MEMORY

BACKGROUND OF THE INVENTION

1. Field of the Invention

The present invention relates to the field of mass storage of data. More particularly, the present invention relates to a non-volatile solid-state mass storage device.

2. Discussion of the Related Art

In electronics, the term mass storage refers to the storage of large amounts of data in a persisting way, even in absence of a power supply. The storage media used for mass storage applications may be divided in three broad classes: magnetic mass storage devices, such as hard disks, floppy disks, drum memories and magnetic tapes; optical mass storage devices, such as compact disks, Digital Versatile Disks (DVDs) and magneto-optical discs; and solid-state mass storage devices, such as Electrically Programmable Memories (EPROM), NOR/NAND flash memories and ovonic memories.

In order to make a comparison of the various mass storage devices, it may be useful to examine their most important features, such as the storing capacity, the data transfer speed and the access time.

More particularly, the greater the storing capacity, the better the mass storage device. However, the cost of a mass storage device significantly depends on said feature, together with the technology used for implementing the device. Magnetic mass storage devices are nowadays those featuring the highest storage capacity, followed by optical mass storage devices and then, last in the rank, by solid-state mass storage devices.

However, magnetic and optical mass storage devices have the great disadvantage of exhibiting a long access time. In fact, referring for example to a hard disk, during a program operation in which data have to be stored in addressed memory locations, data are actually written into said locations after a relatively long access time, e.g., of the order of 10 milliseconds, during which the magnetic read/write head of the hard disk moves for reaching the position on the track corresponding to the addressed memory locations. On the other hand, solid-state mass storage devices have very low, practically null, access times with respect to the other classes.

At the present time the class of mass storage devices featuring the highest data transfer speed (both in program and in read) is that of the magnetic mass storage devices. Modern hard disks, once their magnetic read/write head has been correctly positioned (as discussed above, the time required to bring the read/write head to the addressed memory locations is the access time), are capable to store data with a rate of 20 Mbits per second. On the contrary, the data transfer speeds of the solid-state mass storage devices are lower. For example, modern four-level NAND flash memories typically have program speeds of 2 Mbits per second, while two-level (also referred to as binary) NAND flash memories typically have program speeds of 10 Mbits per second.

As known to those skilled in the art, the data transfer speed of a NAND flash memory, and in particular its program speed, depends on several factors, like: the number of levels to which each memory cell can be programmed, the width of the memory cells' threshold voltage distributions corresponding to the various levels, the duration and the number of program voltage pulses used during the program operation for programming the memory cells.

Since the program operation for a NAND flash memory consists in repeatedly performing the actions of applying a program voltage pulse to the addressed memory cells and then verifying the program state reached by such memory cells after the program pulse voltage application, the highest the number of program voltage pulses, the longer the time required for programming. Consequently, in order to have a program speed that is sufficiently high, it should be necessary to reduce the number of program voltage pulses necessary to bring the memory cells to the target program states.

However, the minimum allowed number of program voltage pulses significantly depends on the number of the program levels, i.e., on the number of the threshold distributions and on their width.

To be able to finely adjust the memory cells' threshold voltage, the increment of the program voltage pulses has to be sufficiently low (and, consequently, the number of pulses necessary for bringing the memory cells to the target program states has to be sufficiently high). This constraint is more severe the higher the number of program levels, i.e. the number of threshold voltage distributions within a certain threshold voltage range of values (wider threshold voltage distributions make it difficult to discriminate the program level; for example, an ideal threshold voltage distribution of a four-level NAND flash memory should have a width of about 150 mV).

For the above reasons, in order to correctly program a multilevel NAND flash memory, more program voltage pulses are needed than in the case of a binary NAND flash memory: consequently, the program speed of a binary NAND flash memory is higher than that of a multilevel NAND flash memory.

Back Pattern Dependency (BPD) and Floating Gate Coupling (FGC) are known effects which cause the widening of the threshold voltage distributions.

In order to describe how the BPD affects the width of the threshold voltage distributions, attention has to be paid to the fact that the memory cells in a NAND flash memory are arranged according to strings of serially-connected memory cells between a drain select transistor, connected to the bit line, and a source select transistor, connected to a reference voltage distribution line; said strings are connected in parallel to each other. When all the memory cells belonging to a same string have to be programmed, usually the first memory cell subjected to programming is the cell connected to the source select transistor of the string, followed by the subsequent memory cells of the string proceeding towards the memory cell connected to the drain select transistor. Therefore, each memory cell of the string to be programmed is connected to the corresponding bit line by means of still non-programmed (i.e., erased) memory cells. With such a program method, the condition (by the resistance point of view) of each memory cell of the string during the program operations (i.e., when their program state is verified) is different than in the case in which all the memory cells of the string have already been programmed. In fact, while the source resistance (i.e., the resistance seen at the source electrode) of each cell to be programmed is the same both during the verify and after that all the memory cells of the string have been programmed, the drain resistance (i.e., the resistance seen at the drain electrode) usually changes. This is due to the fact that while the source resistance depends on the channel resistances of the memory cells that have already been programmed, the drain resistance depends on the channel resistances of the memory cells that probably will change their program states, being not programmed yet. In other words, when the memory cells are subjected to a read operation in order to retrieve their program states later on, said read operation is performed in conditions that may be different from the ones during the verify operations. This (program) pattern dependency increases the width of the threshold voltage distributions corresponding to the non-erased states by a non negligible amount (for example, equal to 50 mV).

Regarding the FGC effect, it is known that the floating gate of a generic memory cell is not totally shielded (from an electrical point of view) from the floating gates of the adjacent memory cells, being instead capacitively coupled thereto. Considering a generic memory cell in the memory cell array, it is surrounded by 8 other memory cells, two along the bit line direction, two along the word line direction and four along the two diagonal directions. As is known to those skilled in the art, the FGC effect depends significantly on the amount of variation in the threshold voltages that the adjacent memory cells experience during the program operations. For example, let us consider a multilevel memory, with memory cells Mc that are adapted to store 2 bits, and whose threshold voltages may be programmed to four different levels, denoted for simplicity as "A", "B", "C", "D" (with A being associated with the erased state and D with the programmed state corresponding to the highest threshold voltage). If a memory cell is adjacent to memory cells that are subjected to program operations for bringing them to the last programmed state D, this memory cell heavily experiences the FCG effect. In fact, since the threshold voltages depend on the amount of electrical charge stored in the floating gates, a memory cell passing from the state A (i.e., corresponding to a condition in which the floating gate has a small amount of electrical charge stored therein) to the state D (i.e., corresponding to a condition in which the floating gate has a high amount of electrical charge stored therein) requires the transfer of a great amount of electrical charge, which in turn affects the threshold voltages of the adjacent floating gates, being capacitively coupled therewith. The higher the variation in the threshold voltages of the memory cells to be programmed, the higher the amount of electrical charge involved in the transfer and the higher the variation in the threshold voltages of the adjacent memory cells. As a consequence, said capacitive coupling between the floating gates of adjacent memory cells increases significantly the width of the threshold voltage distributions corresponding to the non-erased states. In particular, the disturbances on the considered memory cell induced by the programming of the eight adjacent cells may cause the width of the threshold voltage distribution to be increased by 400-500 mV.

In order to prevent that the undesired widening of the threshold voltage distribution impairs the memory operation (which would occur in case two threshold voltage distributions corresponding to two program states overlap), measures need to be taken to ensure that the threshold voltage distributions are narrow, carefully planning the width, the number and the time duration of the program voltage pulses to be applied to the memory cells. Unfortunately, the extent of the undesired effects described above is such as to cause the data transfer speed (during the program operations) of the NAND flash memories to be lower than the transfer speed of magnetic mass storage devices.

As a consequence, magnetic mass storage devices greatly predominate on the market over the other mass storage device classes in all the applications where great amounts of data have to be sequentially stored. In fact, in case a magnetic mass storage device (e.g., a hard disk) has a sufficiently large free space, the data to be sequentially stored can be written in adjacent memory locations; in this way, the positioning of the magnetic read/write head of the hard disk has to be performed only once, for the first memory location, and the high data transfer speed is fully exploited. However, when the amount of data to be stored is not so great, and when the frequency of the access to the storage device is relatively high, it is more advantageous to use solid-state mass storage devices.

Reassuming, apart in case the access to the stored data is very frequent, the most convenient storage media for mass storage applications at the present time are still the magnetic mass storage devices.

However, solid-state mass storage devices are more robust compared to the magnetic (and optical) counterparts, since-solid state devices do not include mechanical and movable parts (like the read/write heads, the spindle and the platters). The presence of such mechanical and movable parts, in addition to cause the devices to be more fragile, prevents the miniaturization thereof, since the sizes of the mechanical parts can not be scaled down in the same way as that of electronic components. Moreover, in order to be capable of moving the mechanical parts, magnetic (and optical) mass storage devices have to include motors, which need power supplies higher than those normally used for supplying electronic devices.

For all these reasons it would be strongly desirable to use solid-state mass storage devices for all mass storage applications. However, to this purpose, their data transfer speed should be increased significantly.

SUMMARY OF THE INVENTION

In view of the state of the art outlined in the foregoing, the Applicant has faced the problem of how to improve the known implementations of solid-state mass storage devices so as to enhance the data transfer speed without penalizing the storage capacity, overcoming the above-mentioned problems.

According to an aspect of the present invention, a solid-state mass storage device is provided. Particularly, the solid-state mass storage device defines a storage area adapted to store data; the storage area is adapted to be exploited for storing data with a first storage density at a first data transfer speed. The storage area comprises at least a first storage area portion and a second storage area portion. The solid-state mass storage device further includes accessing means adapted to exploit the first storage area portion for storing data with a second storage density at a second data transfer speed, and adapted to exploit the second storage area portion for storing data with a third storage density and a third data transfer speed. The second storage density is lower than the third storage density, which is in turn lower than or equal to the first storage density; the second data transfer speed is higher than the third data transfer speed, which is in turn higher than or equal to the first data transfer speed.

BRIEF DESCRIPTION OF THE DRAWINGS

The features and advantages of the present invention will be best understood by reading the following detailed description, given merely by way of non-limitative example, that will be conducted making reference to the accompanying drawings, wherein.

DETAILED DESCRIPTION

Figure 1:
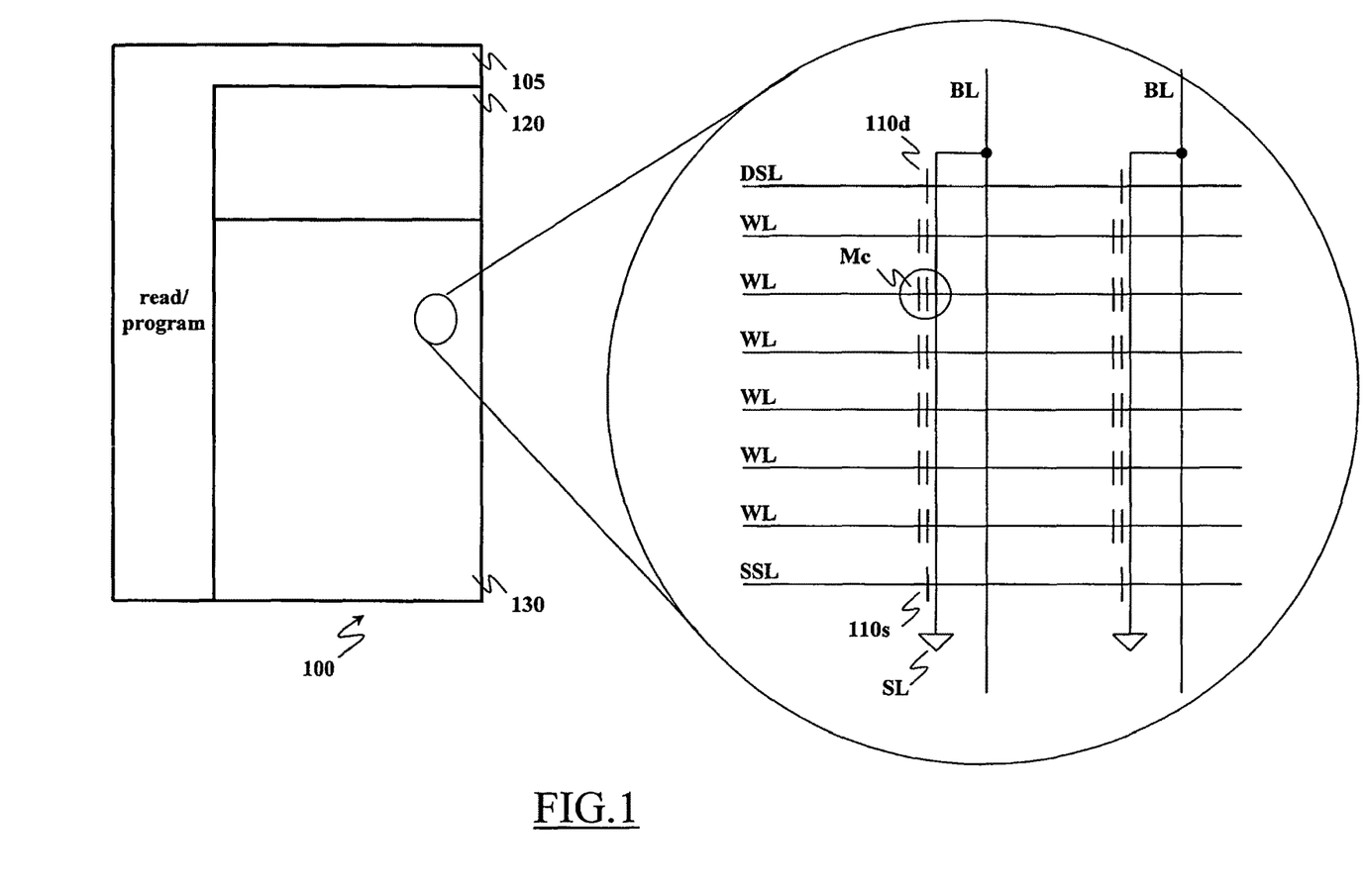
FIG. 1 illustrates a memory space of a solid-state memory device, according to an embodiment of the present invention.

With reference to the drawings, in FIG. 1 a memory space 100 of a solid-state memory device adapted to be used as a mass storage device (e.g., in a video camera or in a digital still camera) is shown according to an embodiment of the present invention. The solid-state memory device is for example a NAND flash memory.

The memory space is physically implemented by means of an array of memory cells, in particular electrically-programmable, non-volatile semiconductor memory cells; hereinafter, reference numeral 100 will also be used to globally identify the array of memory cells. A read and program unit 105 is associated with the array 100, adapted to perform read and program operations on the memory cells thereof.

As schematically illustrated, the memory cells Mc of the array 100 are arranged in a plurality of rows and a plurality of columns. Each memory cell Mc includes an N-channel MOS transistor having a charge-storage element, particularly a conductive floating gate adapted to be charged by electrons. In an erased condition, the generic memory cell Mc has a low threshold voltage. The memory cell Mc is programmed by injecting electric charges into its floating gate; in the programmed condition, the memory cell Mc has a threshold voltage higher than that of the erased condition. Therefore, the value of the threshold voltage defines the different logic values that the datum stored in the memory cell Mc may assume. The memory cell Mc is erased by removing the electrical charge stored in its floating gate.

Each column of the array 100 is associated with a corresponding bit line BL, while each row of the array is associated with a corresponding word line WL.

According to the NAND architecture, groups of, e.g., eight, sixteen or even more (e.g., thirty-two) memory cells Mc are connected in series to each other to form a respective memory cells string, and different memory cells strings belonging to the same column are connected in parallel to each other to the same bit line BL.

The memory cells Mc of a generic string are in particular connected in series between a source select N-channel MOS transistor 110s and a drain select N-channel MOS transistor 110d. A generic, intermediate memory cell Mc in the memory cells string has the drain terminal connected to the source terminal of an adjacent memory cell Mc in the string, and the source terminal connected to the drain terminal of another adjacent memory cell Mc in the string. One of the two end memory cells Mc located at the ends of the string has the drain terminal connected to the source terminal of the drain select transistor 110d; the drain terminal of the drain select transistor 110d is connected to the corresponding bit line BL, as well as to the drain terminal of the corresponding drain select transistor 110d of an adjacent memory cells string. Likewise, the other end memory cell Mc of the string has the source terminal connected to the drain terminal of the source select transistor 110s; the source terminal of the source select transistor 110s is connected to the source terminal of the corresponding source select transistor 110s of another adjacent memory cells string.

The control gate terminals of the memory cells Mc in each row are connected to a corresponding word line WL. The gate terminals of the drain select transistors 110d belonging to a common row of the array 100 are all connected to a corresponding drain select line DSL; similarly, the gate terminals of the source select transistors 110s belonging to a common row are all connected to a corresponding source select line SSL. The drain terminals of the drain select transistors 110d belonging to a common column of the array 100 are connected to a corresponding bit line BL. Conversely, the source terminals of all the source select transistors 110s in the array 100 are connected to a common source line SL (which in operation is typically kept at a reference voltage, or ground).

In the example considered herein, each word line WL corresponds to two different memory pages. More particularly, assuming to assign to each bit line BL an index being an integer number, a first memory page ("even memory page") includes the data stored in the memory cells belonging to bit lines BL in even positions (i.e., whose index is an even number); a second memory page ("odd memory page") includes the data stored in the memory cells belonging to bit lines BL in odd positions (i.e., whose index is an odd number).

As discussed previously, the data transfer speed of a NAND flash memory, particularly in program operations, is limited by constraints that are inherent to the solid-state memory device technology. For the purpose of the present description, by "intrinsic data transfer speed" there is meant the data transfer speed of the NAND memory, assuming to fully exploit the potential storage capacity of the array 100, or of a part thereof (the potential storage capacity is intended to be the maximum amount of data which can be stored using the whole array 100, or the considered part thereof); for example, in the case of a four-level NAND memory, fully exploiting the storage capacity of the array 100, or of a part thereof, means storing, in each memory cell Mc of the array 100, or of the considered part thereof, two bits of information. To fully exploit the potential storage capacity of the memory it is necessary to take, in a program operation, those measures that prevent an excessive widening of the memory cells' threshold voltage distributions: ultimately, this means using several short program voltage pulses; the intrinsic data transfer speed is related to the number of program voltage pulses necessary to bring a memory cell in any target program state.

According to an embodiment of the present invention, under the assumption that the potential storage capacity of the whole array 100 is sufficiently higher than the quantity of data which is usually sent to the memory for being programmed into the array 100 (e.g., an image taken by a digital camera, being for example a file in JPEG format, or an MP3 file), it is possible to exploit the memory space, i.e. the array 100 less efficiently, from the storage capacity viewpoint, in order to remove at the source one or more, possibly all of the causes that contribute to widen the threshold voltage distributions of the memory cells Mc, like the BPD and the FGC effects. This allows to use longer program voltage pulses, so that less pulses are needed to bring a memory cell to a target program state: the data transfer speed is thus increased over the intrinsic data transfer speed.

For the purpose of the present description, by "storage density" of a set of memory cells Mc of the array 100 there is meant the quantity of data which all the memory cells Mc of the considered set are, in use, intended to store, divided by the number of memory cells Mc of the considered set. When the potential storage capacity of the memory cells in the considered set is fully exploited, the storage density of the set of memory cells is maximum; for example, when the potential storage capacity of a set of memory cells of a four-level NAND flash memory is fully exploited, the storage density is equal to 2 bits per cell.

According to an embodiment of the present invention, the memory space is divided into two sub-spaces 120 and 130, corresponding to two sets of memory cells Mc of the array 100. The exploitation of the storage capacity of the memory cells in the first and second sub-spaces 120 and 130 is such that the set of memory cells Mc of the first sub-space 120 has a first storage density lower than a second storage density of the set of memory cells of the second sub-space 130; this allows relaxing the requirements on the width of the memory cells' threshold voltage distributions, and thus the data transfer speed is increased. In particular, the potential storage capacity of the second sub-space 130 may be fully exploited, so that the second storage density is equal to the maximum storage density.

In other words, according to the present invention, the data transfer speed of the first sub-space 120 is increased at the expense of its storage density. It is observed that since the first sub-space 120 is only a portion of the whole memory space 100, thanks to the presence of the second sub-space 130 having a higher storage density, particularly equal to the maximum storage density, the average storage density of the memory device, overall considered, is not significantly reduced, being still relatively high. Therefore, the array 100, overall considered exhibits both a high data transfer speed and a high storage density: the first sub-space 120 is used for rapidly storing data to the detriment of the storage density, while the second sub-space 130 is used for storing data with a higher storage density, possibly equal to the maximum storage density allowed by the memory, to the detriment of the data transfer speed.

It is observed that partitioning the memory space 100 into said two sub-spaces 120 and 130 is purely logic, pertaining only to how the read/program operations are performed by means of the read and program unit 105 on the respective sets of memory cells Mc. From a physical structure viewpoint, the memory cells Mc corresponding to the first sub-space 120 are exactly equal to those forming the second sub-space 130.

Figure 2A:
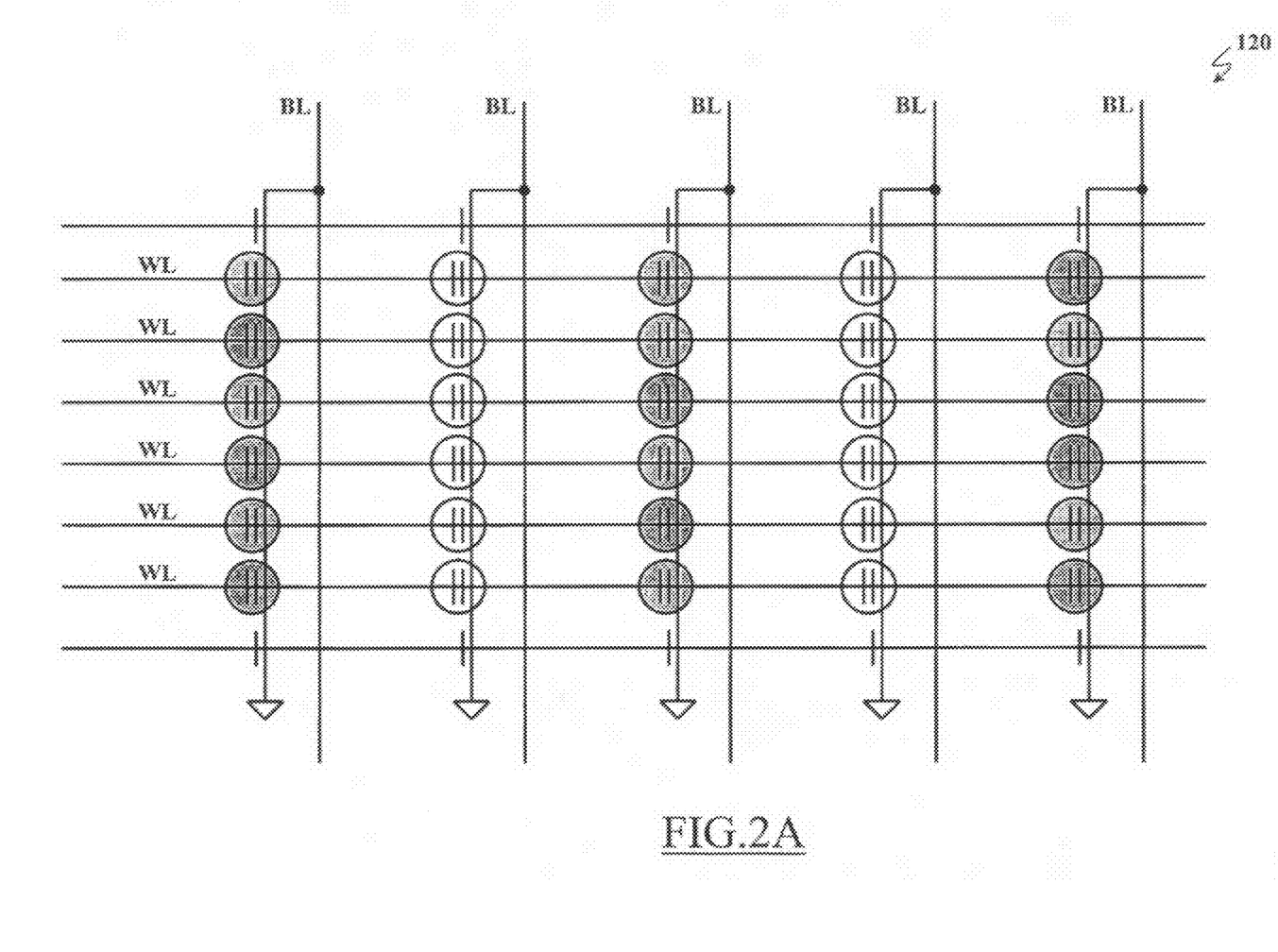
FIGS. 2A-2D shows different solutions for increasing the data transfer speed of a portion of the memory space of FIG. 1, according to different embodiments of the present invention.

According to an embodiment of the present invention, in order to increase the data transfer speed of the first sub-space 120, the FGC effect is reduced by programming the memory cells Mc corresponding only to the even memory pages or only to the odd memory pages. As can be seen in FIG. 2A, wherein a portion of the first sub-space 120 is depicted, and the memory cells Mc that are intended to be used for storing information (i.e., that can be programmed) are depicted in a shaded gray, only the memory cells belonging to non-adjacent bit lines are used for storing information, i.e. may be subject of program operations. Thus, the effects caused by the capacitive coupling of the floating gates is roughly halved, since the memory cells Mc adjacent to the programmed memory cells Mc in the direction of the word lines WL will never be exploited to store data, and thus they will never be programmed, their states remaining unchanged. Consequently, once a memory cell Mc has been programmed, its threshold voltage value will be affected only by subsequent program operations directed to program the two memory cells that are adjacent along the bit line BL direction. Having reduced the effect of the FGC, the resulting memory cells' threshold voltage distributions are narrower, and the memory cells Mc can be programmed in a faster way (the program voltage pulses used to program the memory cells may be longer, and their number, on average, may be reduced). As a result, the data transfer speed of the first sub-space 120 is increased with respect to the intrinsic data transfer speed of the memory, at the cost of halving the storage density, since, according to this embodiment, in the first sub-space 120 only a memory cell every two can be used.

Figure 2B:
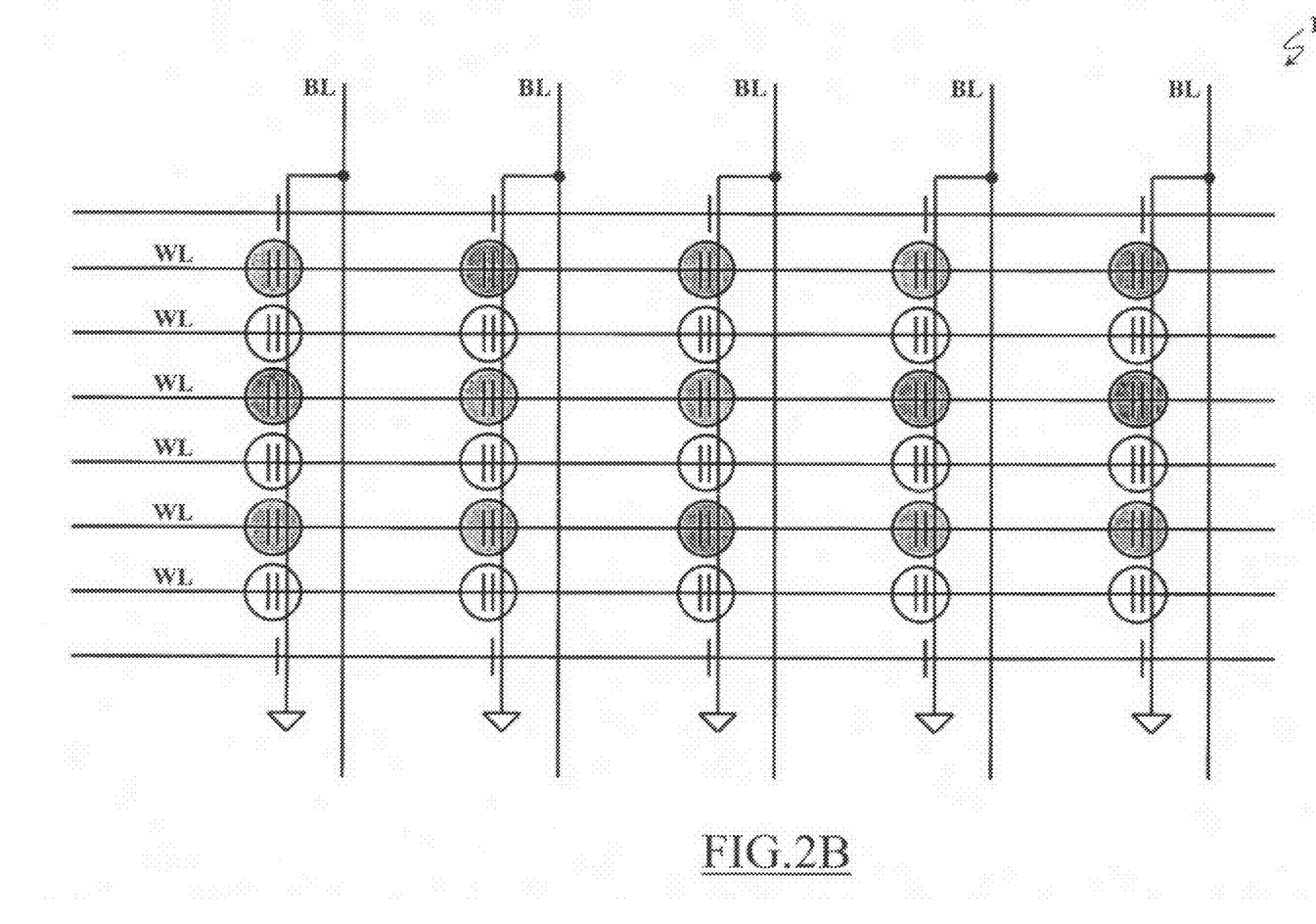

According to another embodiment of the present invention, the FGC effect may also be reduced by storing data in the memory cells Mc corresponding to only one word line WL every two, as depicted in FIG. 2B. In this way, only the memory cells belonging to non-adjacent word lines WL are programmed. As in the case of FIG. 2A, the data transfer speed is increased at the cost of halving the storage density.

Figure 2C:
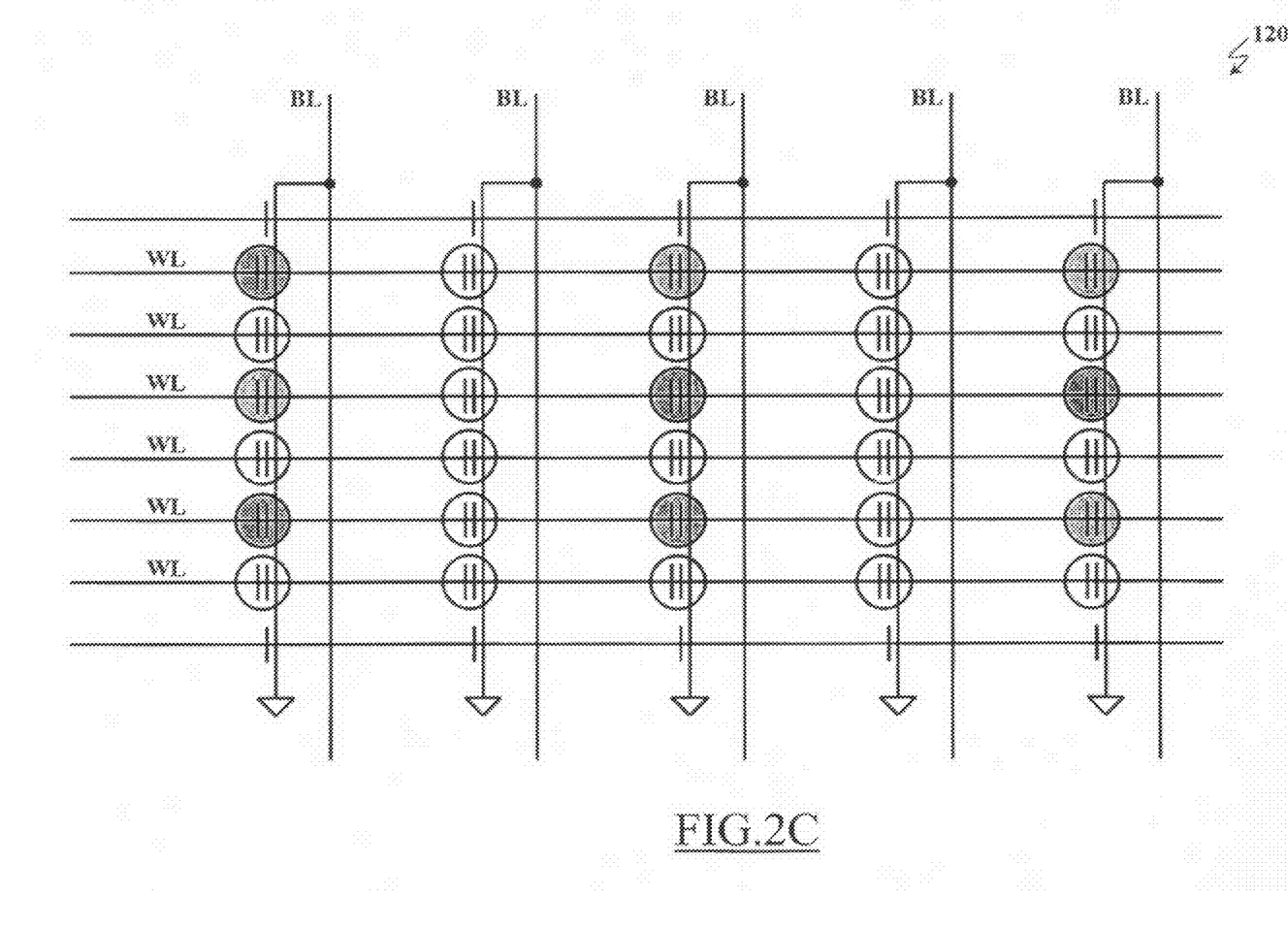

According to a further embodiment of the present invention, in order to drastically lower the FGC effect, only the memory cells Mc corresponding to one word line WL every two and, at the same time, to one bit line BL every two are exploited to store data. In this way, as can be seen in FIG. 2C, each memory cell Mc that is susceptible of being programmed is surrounded by adjacent memory cells that will never be programmed, because they are not used to store data. In this case, the threshold voltage distribution widening effect is greatly reduced, longer program pulses can be used to program the memory cells, and the data transfer speed may be increased significantly, at the cost of reducing the storage density to one quarter.

According to an embodiment of the present invention, the BPD effect can be drastically reduced by using for storing data only one memory cell Mc in each string of memory cells Mc. In this way, the state of the other memory cells Mc of the string is not changed (e.g., they are kept in the erased state), thus both the drain and the source resistances seen by the single the memory cell Mc of the string used to store data remain essentially constant. The data transfer speed can be greatly increased, at the cost of reducing significantly the storage density (the reduction in storage density is higher the higher the number of the memory cells Mc forming a string).

Figure 2D:
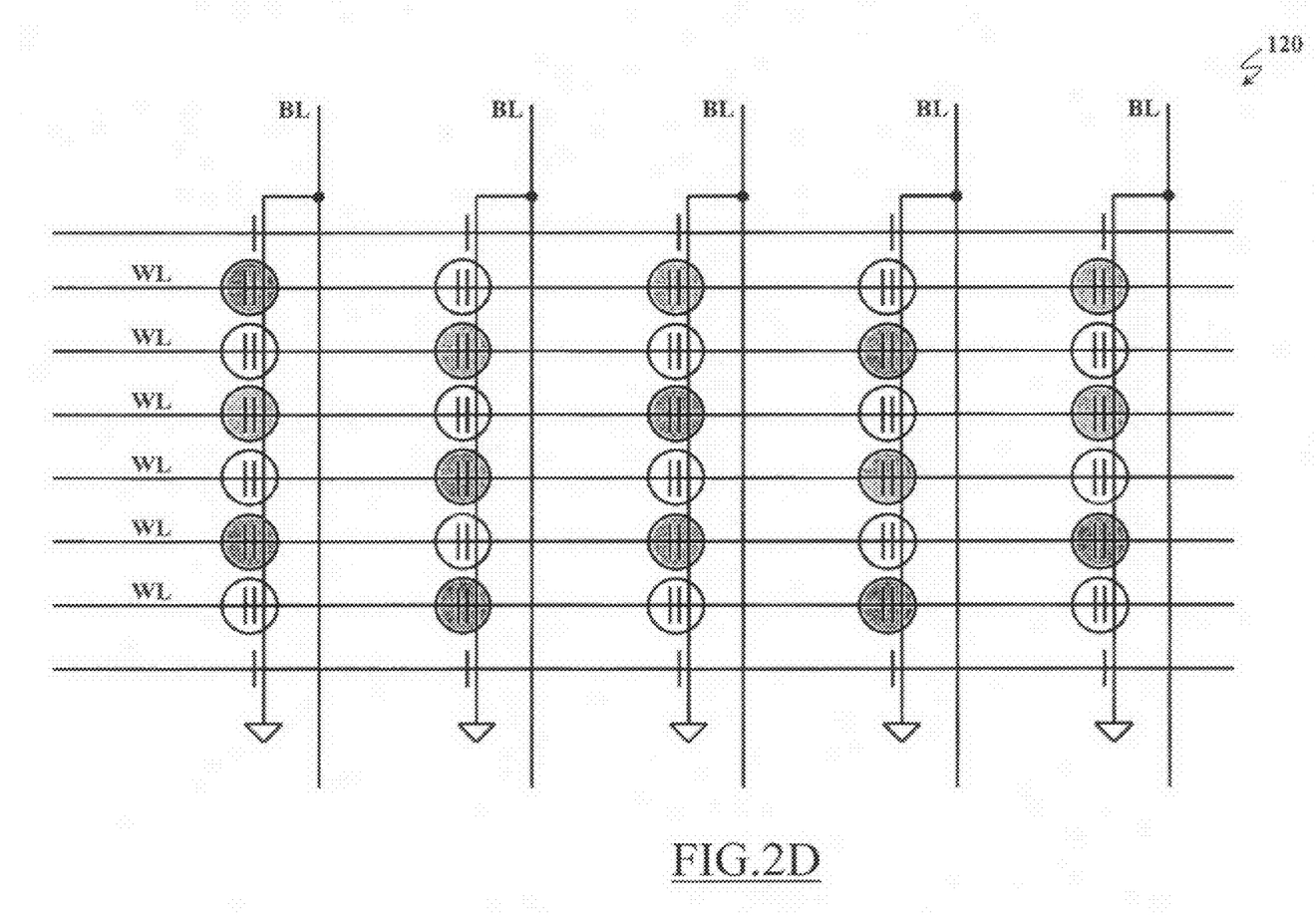

According to a still further embodiment of the present invention, schematized in FIG. 2D, the FGC effect may also be reduced by using to store data the memory cells Mc according to a chess board pattern, i.e., for each pair of adjacent word lines WL exploiting the memory cells Mc corresponding to an even memory page for the first (or second) word line WL of the pair and corresponding to an odd memory page for the other word line WL of the pair. As in the previous cases, the data transfer speed is increased at the cost of halving the storage density.

Although in all the above described embodiments the solutions provided were directed to increase the data transfer speed compared to the intrinsic data transfer speed by eliminating or reducing the causes that contribute to widen the threshold voltage distributions of the memory cells Mc, other solutions are possible, both taken alone and in combination with those previously described.

For example, if the memory is a multilevel memory, with memory cells Mc whose threshold voltage is adapted to be programmed to, e.g., four different levels (i.e., adapted to store 2 bits), the data transfer speed may be increased by treating the memory cells Mc belonging to first sub-space 120 as if they were two-level memory cells (i.e., memory cells adapted to store only 1 bit each). Thus, a lower number of threshold voltage distributions need to be allocated in a given threshold voltage range of values, and the threshold voltage distributions corresponding to the two possible program states can be kept rather spaced apart: longer program voltage pulses can thus be used, and the data transfer speed may thus be increased since a lower number of program pulses are (on average) necessary to program the memory cells; the storage density is also in this case halved.

One or more of the abovementioned solutions for increasing the data transfer speed compared to the intrinsic data transfer speed are exploited for the first sub-space 120, but they are not employed for the second sub-space 130. In fact, the main function of the second sub-space 130 is to store data with a high storage density, possibly the maximum storage density, while all the abovementioned solutions penalize the storage density to the benefit of the data transfer speed.

For example, if the memory cells Mc of the array 100 are multilevel cells, e.g., four-level cells, in order to increase the data transfer speed the cells of the first sub-space 120 were two-level memory cells, i.e., their capability of storing 2 bits each is not exploited and they are used to store only 1 bit each, the memory cells Mc of the second sub-space 130 may instead be used to store 2 bits each, i.e. their storage potential is fully exploited, in order to increase the storage density.

As another example, if in the first sub-space 120 only the memory cells Mc corresponding to one word line WL every two are used to store data, in the second sub-space 130 all the memory cells Mc corresponding to all the word lines WL are exploited.

According to a further embodiment of the present invention, it is possible to reduce the FGC effect, maintaining at the same time a relatively high storage density, provided that the quantity of data which is sent to the memory device for being programmed into the second sub-space 130 is higher than the storage capacity of a memory page.

For example, in case an amount of data having the size of two memory pages has to be stored into the second sub-space 130, the FGC effect can be reduced by storing the data into two (even and odd) memory pages corresponding to a same word line WL, using a particular programming algorithm, that will be described below.

As discussed in the introduction of the present description, the program operation for a NAND flash memory includes the repetition of a plurality of n steps, each step including applying a program voltage pulse VP(i) (i=1 to n), possibly increasing the value of the program voltage pulse VP(i) (up to a maximum value, e.g. 20V) at each step and, after the application of each program voltage pulse VP(i), verifying whether the desired threshold voltage value has been reached.

In order to program two memory pages (even and odd) corresponding to a same word line WL, the following operations may be performed:

1) programming, by applying $n_1$ program voltage pulses VP(i) thereto, the memory cells Mc belonging to an addressed even memory page:

VP(1)[e]; VP(2)[e]; . . . ; VP(i)[e]; . . . ; VP($n_1$−1)[e]; VP($n_1$)[e]

2) programming, by applying $n_2$ (where $n_2$ is in general different from $n_1$) program voltage pulses VP(i) thereto, the memory cells Mc belonging to an addressed odd memory page:

VP(1)[o]; VP(2)[o]; . . . ; VP(i)[o]; . . . ; VP($n_2$−1)[o]; VP($n_2$)[o], wherein VP(i)[e] represents the application of the program voltage pulse VP(i) to the memory cells belonging to the even memory page at the step i, while VP(i)[o] represents the application of the program voltage pulse VP(i) to the memory cells belonging to the odd memory page at the step i. In other words, the memory cells Mc belonging to one of the two memory pages (in the example herein considered, the odd memory page, but same considerations apply in case of the even memory page) are programmed only after that the memory cells Mc of the other memory page (in this example, the even memory page) have been programmed.

Such a method exhibits the problem that the threshold voltage distribution of memory cells Mc that are adjacent (in the word line WL direction) are strongly affected by the FGC effect. In fact, because of the presence of capacitive coupling between the floating gates of adjacent memory cells Mc, and since the memory cells Mc belonging to an even memory page are interleaved with the memory cells Mc belonging to the odd memory page of the same word line WL, applying program voltage pulses VP(i) to the memory cells Mc of one memory page after that the memory cells Mc of the other memory page have been already programmed modifies the threshold voltages of the latter memory cells Mc. As already discussed, in order to prevent that the undesired widening of the threshold voltage distribution impair the memory operation (which would occur in case two threshold voltage distributions corresponding to two program states overlap), measures need to be taken for ensuring that the threshold voltage distributions are narrow, for example reducing the length and increasing the number of program voltage pulses; this cause an increase in data transfer speed.

A programming algorithm according to an embodiment of the present invention includes instead the following sequence of operations:

VP(1)[e]; VP(1)[o]; VP(2)[e]; VP(2)[o]; . . . ; VP(i)[e]; VP(i)[o]; . . . ; VP(n−1)[e]; VP(n−1)[o]; VP(n)[e] VP(n)[o].

Thus, each program voltage pulse VP(i) is applied firstly to the memory cells Mc of the even memory page, and then to the memory cells of the odd memory page corresponding to the same word line WL. Said operations are then repeated for each program voltage pulse VP(i) (i=1 to n).

Using the above programming algorithm, the memory cells Mc of both an even memory page and an odd memory page of a same word line WL are subjected to the application of the same program voltage pulses (in the program voltage pulses sequence) in consecutive times. Therefore, the variations in the threshold voltages of all the memory cells of the word line WL are generated step by step on all the memory cells of the word line WL. In this way, floating gates of adjacent memory cells (along the word line WL direction) experience reduced electrical charge variations; as a consequence, the impact of the FGC effect on the threshold voltage width is reduced.

According to a further embodiment of the present invention, the above programming algorithm is repeated two times (on the same memory cells). Particularly, during a first iteration the memory cells are programmed with a rough accuracy in a fast way, and then, during a second iteration, the threshold voltages of the various memory cells are programmed in a more fine way, starting from the conditions reached with the first iteration. Since during the second iteration the threshold voltages are varied by a small amount only, the FCG effect is reduced even more.

Figure 3:
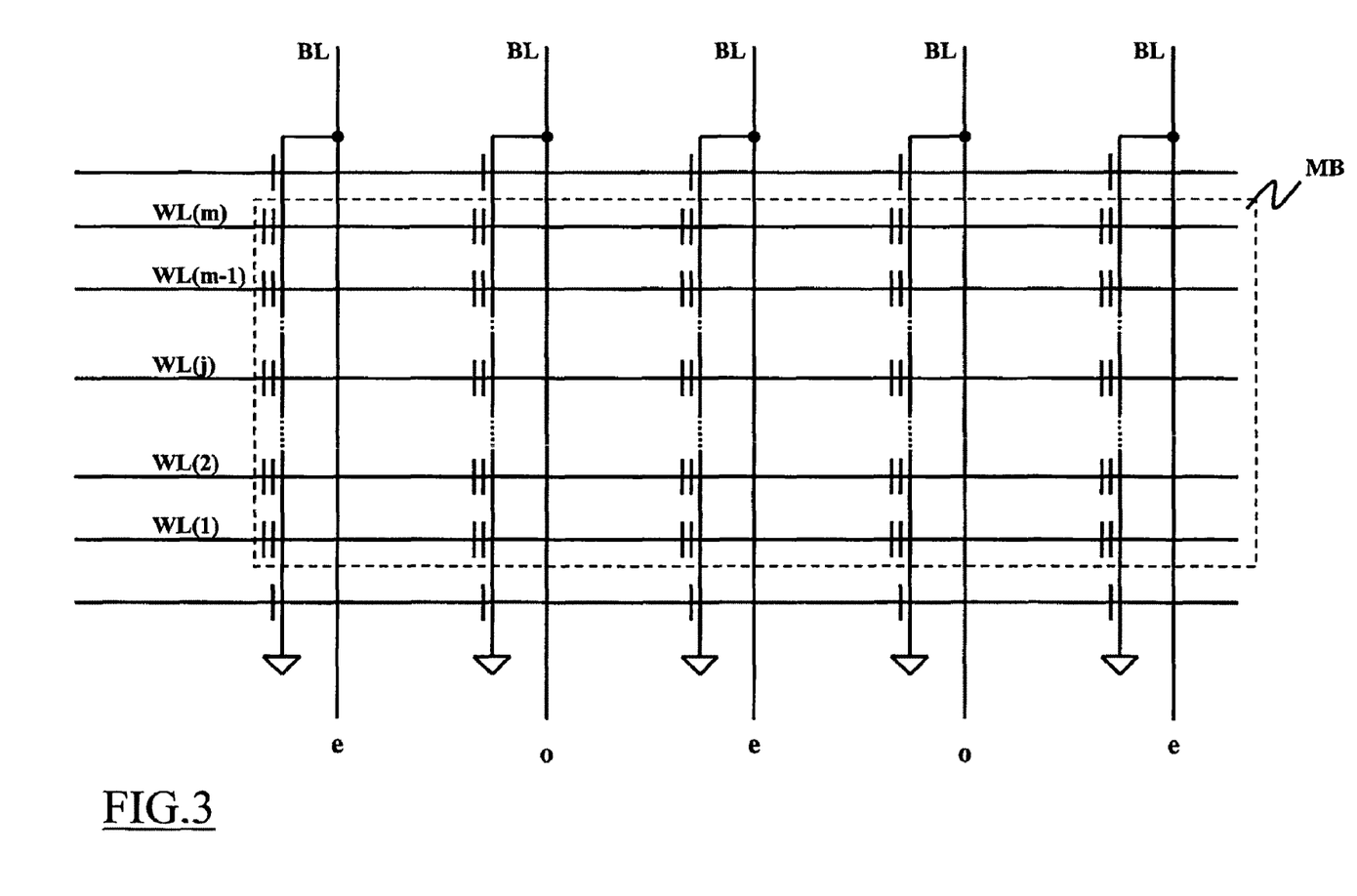
FIG. 3 depicts a memory block of the solid-state device.

According to a further embodiment of the present invention, another programming algorithm is proposed, adapted to reduce the impact on the threshold voltage width of the FGC effect and, in addition, of the BPD effect. Provided that the amount of data which are sent to the memory device for being stored into the second sub-space 130 is equal to the storage capacity of a memory block MB. As schematically illustrated in FIG. 3, by memory block MB there is intended the collection of all the memory cells Mc belonging to the strings which correspond to same word lines WL(j) (j=1 to m, wherein m is the number of memory cells Mc included in a string).

In particular, using the same notation used for describing the preceding programming algorithm, the programming algorithm according to this further embodiment of the invention comprises the following sequence of operations:

```
for i = 1 to n {
    for j = 1 to m {
        WL(j): VP(i)[e]
        WL(j): VP(i)[o]
    }
},
``` wherein the operation "WL(j): VP(i)[e]" represents the application of the program voltage pulse VP(i) to the memory cells Mc belonging to the even memory page of the word line WL(j) at the step i, and the operation "WL(j): VP(i)[o]" represents the application of the program voltage pulse VP(i) to the memory cells Mc belonging to the odd memory page of the word line WL(j) at the step i. Thus, each program voltage pulse VP(i) is applied firstly to the memory cells Mc of the even memory page, and then to the memory cells of the odd memory page of all the word lines WL(j) of the string, starting from the word line WL(1) corresponding to the cells connected to the source select transistors 110s, and proceeding towards the word line WL(m) corresponding to the cells connected to the drain select transistors 110d. Said operations are then repeated for each program voltage pulse VP(i) (i=1 to n). In this way, both the FCG effect and the BPD effect are reduced, for the same reasons previously described in accordance to the previous programming algorithm.

According to a still further embodiment of the present invention, also the above described programming algorithm is repeated two times (with a rough iteration and a fine iteration), for reducing even more the FCG effect.

According to an embodiment of the present invention, this reduction of the memory cells' threshold voltage distributions widening caused by the BPD and FGC effects allows storing data in the sub-space 130 with a storage density higher than the maximum storage density given by the full exploitation of the potential storage capacity; for example, if the potential storage capacity of a set of memory cells of a four-level NAND flash memory, when fully exploited, provides a storage density of 2 bits per cell, by using the above-mentioned programming algorithms it should be possible to increase the storage density by, e.g., one bit.

It is observed that, in an embodiment of the present invention, the two sub-spaces 120 and 130 may have a fixed, predetermined size; in an alternative embodiment of the invention, the size of the two sub-spaces 120 and 130 may change, depending on the usage thereof: for example, when data to be programmed with a high data transfer speed are received, the size of the sub-space 120 increases, and the size of the sub-space 130 correspondingly decreases.

According to an embodiment of the present invention, in order to more efficiently exploit the memory space 100, by increasing the average storage density thereof, data that have been stored in the first sub-space 120, penalizing the storage capacity of the cells, are moved to the second sub-space 130 (thus, less memory space is used for storing the same amount of data) when the memory has time for doing so, e.g. in batch, or in background.

Figure 4:
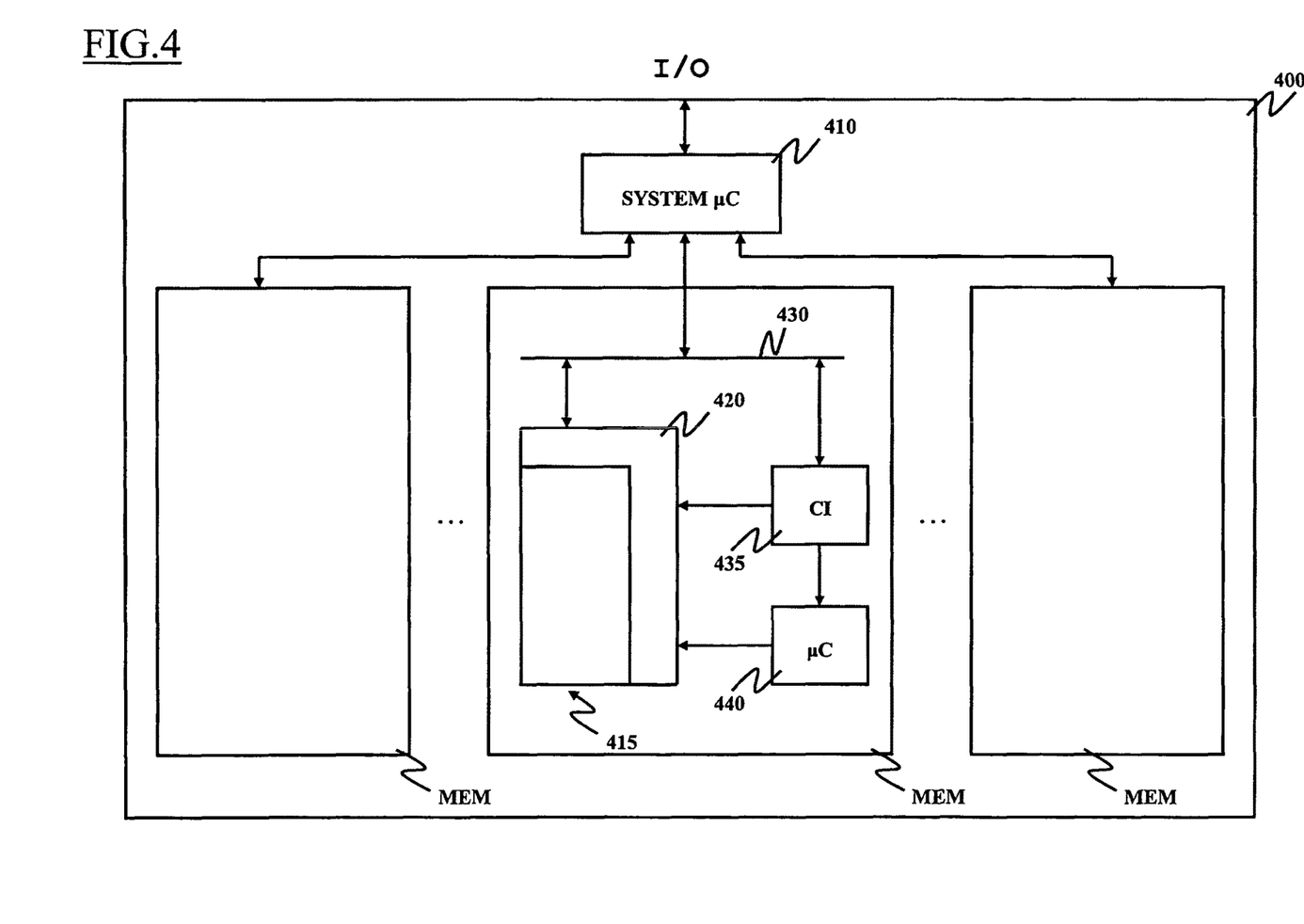
FIG. 4 illustrates a solid-state mass storage device, according to an embodiment of the present invention.

Referring now to FIG. 4, a solid-state mass storage device 400 is schematically illustrated, according to an embodiment of the present invention. The solid-state mass storage device 400 can be embedded in a more complex electronic system, for example a memory card, a video camera, a digital still camera or a USB storage device. The solid-state mass storage device 400 includes a plurality of memory modules MEM, having, for example, the same structure. The solid-state mass storage device 400 further includes a system controller 410, adapted to control the operation of the storage device 400, and particularly to instruct the memory modules MEM. The system controller 410 is adapted to receive commands from, and to receive/provide data from/to the outside of the storage device 400. The system controller 410 is connectable to the outside of the solid-state mass storage device 400 by means of an input/output bus I/O, and it is operatively coupled to all the memory modules MEM of the solid state mass storage device 400.

One or more of the memory modules MEM has a memory space physically implemented by means of an array 415 of memory cells, that is for example structured as the array 100 of FIG. 1, and to which there is associated a read and program unit 420 adapted to perform read and program operations on the memory cells of the array 415. The read and program unit 420 is operatively coupled to the system controller 410 by means a memory module bus 430. The memory module MEM further includes a Command Interface (CI) 435, adapted to receive and interpret commands provided by the system controller 410 through the module bus 430 and instructing the read and program unit 420. The CI 435 is also connected to a microprocessor 440, adapted to instruct the read and program unit 420 according to the commands interpreted by the CI.

In particular, the microprocessor 440 is adapted to control the read and program unit 420 in order to implement predetermined programming algorithms. In particular, the program operations on the cells of the array 415 may be performed as if the array 415 were divided into the first and second sub-spaces 120 and 130, as described in connection with FIG. 1.

When data are to be stored into the solid-state mass storage device 400, the system controller 410 firstly checks the various memory modules MEM, so as to control if there is a memory module having a sufficient free memory space for storing said data. Then, the system controller 410 routes the data to the selected memory module MEM.

For the sake of the simplicity, it is assumed that the memory space of the selected memory module MEM is entirely free, i.e., all its memory cells are erased. In this condition, the whole memory space represented by the array 100 is in a so-called "free state", available for storing data.

In order to increase the data transfer speed, the system controller 410 may instruct the microprocessor 440, through the CI 435, to store the incoming data into the memory array 100 in a fast mode, e.g. adopting one of the solutions previously described which allow increasing the program speed penalizing the storage density; the memory locations wherein the data are thus written define the sub-space 120 within the memory space of the array 415. More particularly, the read and program unit 420 operates under the control of the microprocessor 440 implementing the desired programming algorithms to program the incoming data, using, for example, one or more of the previously described solutions, e.g., programming the memory cells corresponding to only a word line of the array 415 every two, and/or do not totally exploit the bit storing capability of the memory cells, etc.

After the data have been programmed, the memory space of the array 415 is logically divided into a sub-space 120, corresponding to the memory locations where the data have been stored, and in a remaining memory space still in the free state.

When further data are to be stored into the array 415 of that memory module, the system controller 410 may again instruct the microprocessor 440 to program the incoming data according to the fast mode. As a result, the cache space 120 increases, while the memory space in the free state diminishes.

According to an embodiment of the present invention, in order to more efficiently exploit the memory space 415 by increasing the average storage density thereof increase, data that have been stored programming the memory cells in fast mode, penalizing the storage capacity of the cells, are "compressed" in batch during any dead time of the memory module MEM, e.g., when it is not instructed to store incoming data, according to the policy established by the system controller 410.

For this purpose, the system controller 410 instructs the microprocessor 440, through the CI 435, for performing a "data compression" operation on the data which are stored in the cache space 120.

The compression operation involves a programming operation performed in a way that allows fully (or better) exploiting the potential storage capacity of a set of memory cells used to stored those data: this means, for example, exploiting all the word lines, all the bit lines, and the maximum of the storage capacity of each cell; for example, memory cells in the free state may be exploited to this end, defining a corresponding second sub-space 130. The compressed data may be removed from the first sub-space 120, to free memory space for new data to be stored.

In this way, the memory space 415 is dynamically subdivided in three spaces: a cache space, a storage space and a free space. Each one of said spaces has a size which can vary during the operation of the solid-state mass storage device 400, according to the instructions provided by the system controller 410.

Furthermore, it is possible to perform a data decompression operation, i.e., to moving data from the second sub-space 130 to the first sub-space 120.

According to an embodiment of the present invention, data can also be directly stored into the second sub-space 130, without the need of being firstly stored in the first sub-space 120 and then compressed in the second sub-space 130. This is useful when the free space of the memory is limited, and data have to be directly stored with an high storage density.

Moreover, according to a further embodiment of the present invention, the type of program (fast or not) that has to be performed can be directly established by the user of the solid-state mass storage device 400, providing a dedicated command to the system controller 410.

According to an embodiment of the present invention, the first sub-space 120, or a part thereof, may be advantageously exploited for (rapidly) storing data that typically have to be frequently accessed (both in program and in read), such as pointers and parameters.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

What is claimed is:

1. A solid-state mass storage device defining a storage area adapted to store data, the storage area being adapted to be exploited for storing data with a first storage density at a first data transfer speed, the storage area comprising at least a first storage area portion and a second storage area portion, the solid-state mass storage device further including accessing means adapted to exploit the first storage area portion for storing data with a second storage density at a second data transfer speed, and adapted to exploit the second storage area portion for storing data with a third storage density and a third data transfer speed, wherein: the second storage density is lower than the third storage density, which is in turn lower than or equal to the first storage density;

the second data transfer speed is higher than the third data transfer speed, which is in turn higher than or equal to the first data transfer speed;

the storage area is defined by a memory array comprising a plurality of memory cells adapted to store data, arranged according to a plurality of rows and a plurality of columns; and the columns of memory cells are arranged according to at least a first and a second collections of columns, the columns of the first collection being alternated to the columns of the second collection;

said accessing means is adapted to cause data to be stored in said first storage area portion in one of:

i) only in the memory cells belonging to the columns of said first collection or only to columns of said second collection such that the memory cells of the first storage area portion belonging to the first or to the second collection are left unprogrammed;

ii) only in memory cells of even rows or only in memory cells of odd rows such that the memory cells of the first storage area portion belonging to the even or to the odd rows are left unprogrammed;

iii) only in memory cells such that the memory cells that are immediately adjacent to said memory cells in said row and said column are left unprogrammed.

2. The solid-state mass storage device according to claim 1, wherein the memory cells are multilevel cells, each one adapted to be exploited for storing a predetermined number of bits, the predetermined number being higher than one.

3. The solid-state mass storage device according to claim 2, wherein the accessing means is adapted to cause the memory cells in the first storage portion to be exploited to store in each one of them a number of bits smaller than the predetermined number.

4. The solid-state mass storage device according to claim 1, wherein the accessing means is adapted to apply a sequence of program voltage pulses to each memory cell of an addressed group of memory cells in the first or in the second storage area portion in order to store data therein.

5. The solid-state mass storage device according to claim 4, wherein:

the addressed group of memory cells includes memory cells belonging to at least one row; and the accessing means is adapted to apply each program voltage pulse to the memory cells of the addressed group that belong to the columns of the first collection and to the memory cells of the addressed group that belong to the columns of the second collection in consecutive times.

6. The solid-state mass storage device according to claim 5, wherein the accessing means is adapted to exploit the first or the second storage area portion for storing data with a fourth storage density at a fourth data transfer speed, wherein the fourth storage density is higher than the first storage density and the fourth data transfer speed is lower than the first data transfer speed.

7. The solid-state mass storage device according to claim 1, wherein the solid-state mass storage device is a NAND flash memory device.

8. A method of using a storage area of a solid-state mass storage device in order to store data, wherein the storage area is adapted to be exploited for storing data with a first storage density at a first data transfer speed, the method comprising:

receiving data to be stored into the mass storage device; and either using a first storage area portion of said storage area for storing the received data with a second storage density at a second data transfer speed, or using a second storage area portion of said storage area for storing the received data with a third storage density and a third data transfer speed, wherein the second storage density is lower than the third storage density, which is in turn lower than or equal to the first storage density, and the second data transfer speed is higher than the third data transfer speed, which is in turn higher than or equal to the first data transfer speed;

the storage area is defined by a memory array comprising a plurality of memory cells adapted to store data, arranged according to a plurality of rows and a plurality of columns; and the columns of memory cells are arranged according to at least a first and a second collections of columns, the columns of the first collection being alternated to the columns of the second collection;

storing the received data in one of:
i) only in the memory cells belonging to the columns of said first collection or only to columns of said second collection such that the memory cells of the first storage area portion belonging to the first or to the second collection are left unprogrammed;
ii) only in memory cells of even rows or only in memory cells of odd rows such that the memory cells of the first storage area portion belonging to the even or to the odd rows are left unprogrammed;
iii) only in memory cells such that the memory cells that are immediately adjacent to said memory cells in said row and said column are left unprogrammed.

9. The method according to claim 8, wherein the memory cells are multilevel cells, each one adapted to be exploited for storing a predetermined number of bits, the predetermined number being higher than one.

10. The method according to claim 9, wherein causing the memory cells in the first storage portion to be exploited to store in each one of them a number of bits smaller than the predetermined number.

11. The method according to claim 8, further comprising:
addressing a group of memory cells in the first or in the second storage area portion in order to store data therein; and
applying a sequence of program voltage pulses to each memory cell of the addressed group of memory cells.

12. The method according to claim 8, wherein the addressed group of memory cells includes memory cells belonging to at least one row, the method further including:
applying each program voltage pulse to the memory cells of the addressed group that belong to the columns of the first collection and to the memory cells of the addressed group that belong to the columns of the second collection in consecutive times.

13. The method according to claim 12, further comprising:
storing the received data, in the first or in the second storage area portion, with a fourth storage density higher than the first storage density at a fourth data transfer speed lower than the first data transfer speed.

14. The method of claim 8, further comprising:
performing a data transfer within said storage area by causing data stored with said second storage density and at said second data transfer speed in the first storage area portion to be stored with said third storage density and at said third data transfer speed into the second storage area portion, or vice versa.

15. The method according to claim 14, further comprising:
performing a data compression by storing data stored in the first storage area portion or in the second storage area portion with said fourth storage density and at said fourth data transfer speed.

16. The method of claim 15, wherein said data transfer and data compression are performed when the solid-state mass storage device is not engaged in storing received data.

* * * * *